US009470718B2

(12) United States Patent
Fukasawa et al.

(10) Patent No.: US 9,470,718 B2
(45) Date of Patent: Oct. 18, 2016

(54) PROBE CARD

(71) Applicant: Shinko Electric Industries Co., Ltd., Nagano (JP)

(72) Inventors: Ryo Fukasawa, Nagano (JP); Michio Horiuchi, Nagano (JP); Yasue Tokutake, Nagano (JP); Yuichi Matsuda, Nagano (JP); Mitsuhiro Aizawa, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 14/327,732

(22) Filed: Jul. 10, 2014

(65) Prior Publication Data

US 2015/0022229 A1   Jan. 22, 2015

(30) Foreign Application Priority Data

Jul. 19, 2013   (JP) .................................. 2013-150104

(51) Int. Cl.
*G01R 1/073* (2006.01)
(52) U.S. Cl.
CPC ................................ *G01R 1/07371* (2013.01)
(58) Field of Classification Search
CPC .... G01R 3/00; G01R 1/073; G01R 1/07314; G01R 1/07342; G01R 31/2601; G01R 31/2886; G01R 31/00; G01R 1/07371
USPC .................................................... 324/756.03
See application file for complete search history.

(56) References Cited

U.S. PATENT DOCUMENTS

| 3,866,119 A * | 2/1975 | Ardezzone et al. ..... 324/755.11 |
| 6,236,112 B1 * | 5/2001 | Horiuchi ............... H01L 21/486 |
| | | 257/734 |
| 7,148,576 B2 | 12/2006 | Nemoto |
| 7,884,632 B2 * | 2/2011 | Shiraishi et al. ........ 324/750.25 |

(Continued)

FOREIGN PATENT DOCUMENTS

| JP | S59-154054 | 9/1984 |
| JP | H09-229963 | 9/1997 |

(Continued)

OTHER PUBLICATIONS

Takehashi, Nobuitsu, machine translation of JP 09-229963 A, Sep. 1997.*

(Continued)

*Primary Examiner* — Jermele M Hollington
*Assistant Examiner* — Khristopher Yodichkas
(74) *Attorney, Agent, or Firm* — Kratz, Quintos & Hanson, LLP

(57) ABSTRACT

A probe card, includes, a wiring substrate having an opening portion and including a first connection pad and a second connection pad, the first connection pad being arranged at a periphery of the opening portion, the second connection pad being arranged to be adjacent to the first connection pad, a resin portion formed inside the opening portion of the wiring substrate, a first wire buried in the resin portion and having one end connected to the first connection pad and the other end constituting a first contact terminal protruding from a lower face of the resin portion, and a second wire buried in the resin portion and having one end connected to the second connection pad and the other end constituting a second contact terminal protruding from a lower face of the resin portion.

5 Claims, 9 Drawing Sheets

(56) References Cited

U.S. PATENT DOCUMENTS

| | | |
|---|---|---|
| 2003/0062631 A1 | 4/2003 | Nemoto |
| 2005/0057235 A1* | 3/2005 | Watanabe .................. G05F 1/56 323/273 |
| 2011/0062596 A1* | 3/2011 | Murayama ............ H01L 21/568 257/777 |
| 2014/0125372 A1* | 5/2014 | Fukasawa et al. ....... 324/756.03 |
| 2015/0022230 A1* | 1/2015 | Fukasawa et al. ....... 324/756.03 |
| 2015/0137849 A1* | 5/2015 | Horiuchi et al. ........ 324/756.03 |

FOREIGN PATENT DOCUMENTS

| | | |
|---|---|---|
| JP | 2000-294311 | 10/2000 |
| JP | 2003-174120 A1 | 6/2003 |

OTHER PUBLICATIONS

Nemoto, Yoshihiko, machine translation of JP 2003-174120 A Jun. 2003.*

* cited by examiner

FIG. 4A
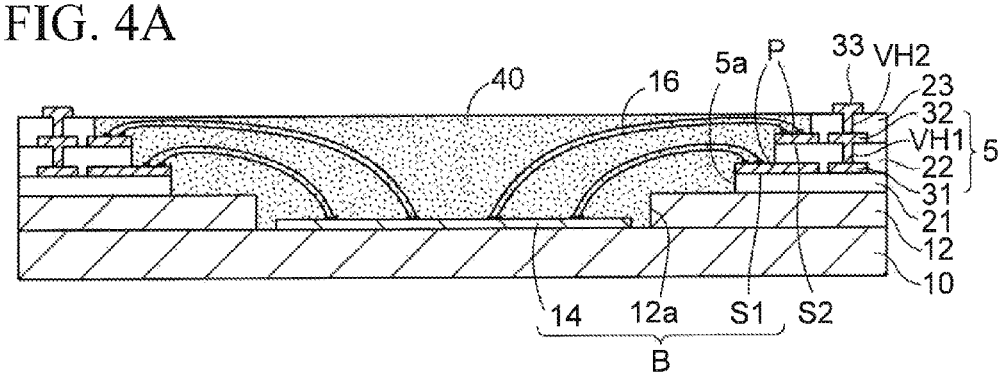
FIG. 4B
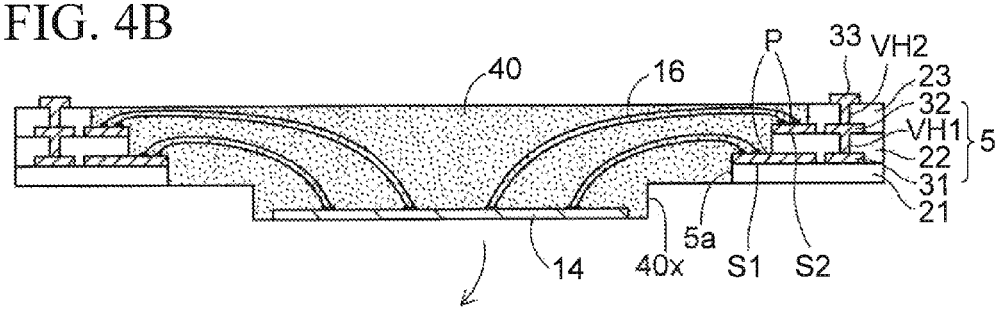
FIG. 4C
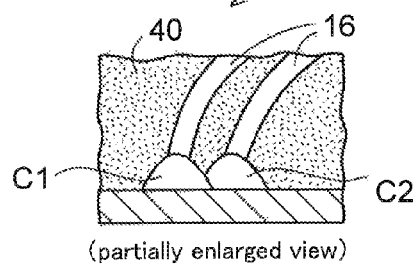
(partially enlarged view)
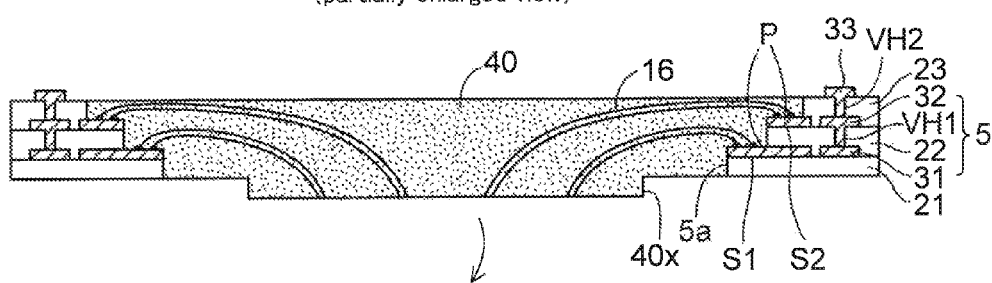
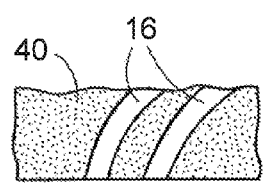
(partially enlarged view)

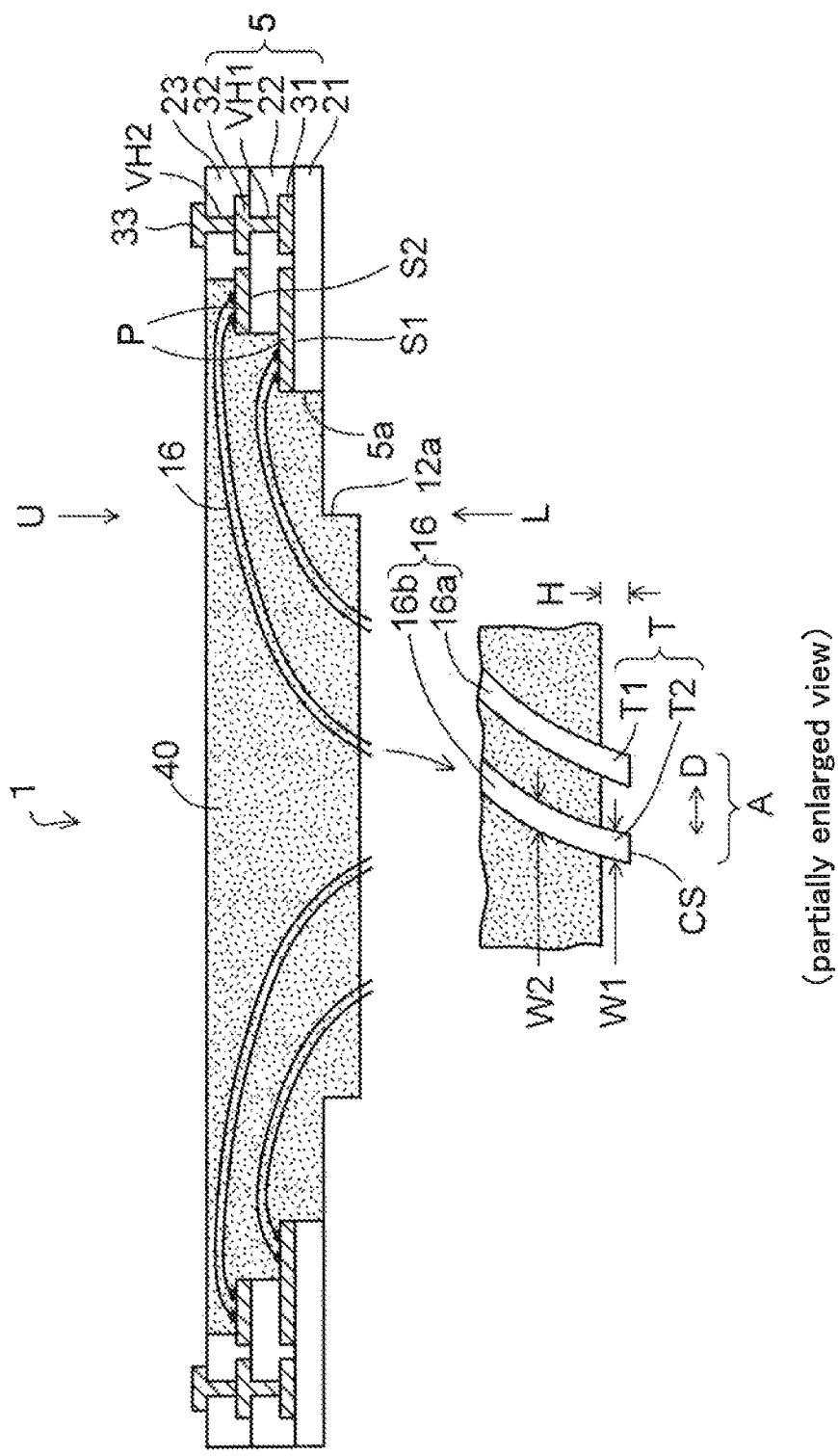

(partially enlarged view)

PROBE CARD

CROSS-REFERENCE TO RELATED APPLICATIONS

This application is based upon and claims the benefit of priority of the prior Japanese Patent Application No. 2013-150104, filed on Jul. 19, 2013, the entire contents of which are incorporated herein by reference.

FIELD

This invention is related to a probe card and a method of manufacturing the same.

BACKGROUND ART

Measurement of electric characteristics of a test object such as a wiring substrate or the like is performed by touching contact terminals of a probe card to many electrode pads of the test object and attaining conduction therebetween.

A related art is disclosed in Japanese Laid-open Patent Publication No. 59-154054, Japanese Laid-open Patent Publication No. 09-229963, Japanese Laid-open Patent Publication No. 2000-294311, and Japanese Laid-open Patent Publication No. 2003-174120.

SUMMARY

As a method for accurately measuring electric characteristics of a test object, there is four-terminal test in which electric measurement is performed by touching two adjacent contact terminals to one electrode pad of the test object. In the probe cards for four-terminal test, it is necessary that further narrower pitch of the contact terminals is advanced, but it is difficult to response by the manufacturing methods of the prior art.

According to one aspect discussed herein, there is provided a probe card, including a wiring substrate including an opening portion and a first connection pad and a second connection pad, the first connection pad arranged in a periphery of the opening portion, the second connection pad arranged to be adjacent to the first connection pad, a resin portion formed in the opening portion of the wiring substrate, a first wire buried in the resin portion, the first wire in which one end is connected to the first connection pad and other end constitutes a first contact terminal protruding from a lower face of the resin portion, and a second wire buried in the resin portion, the second wire in which one end is connected to the second connection pad and other end constitutes a second contact terminal protruding from the lower face of the resin portion, wherein each diameter of the first contact terminal and the second contact terminal is equal to each diameter of the first wire and the second wire in the resin portion, and the first contact terminal and the second contact terminal are gathered to be separated each other such that the first and second contact terminals contact one electrode pad of a test object with a pair.

Also, according to another aspect discussed herein, there is provided a method of manufacturing a probe card, including preparing a wiring substrate including an opening portion and connection pads arranged in a periphery of the opening portion, bonding the wiring substrate to a metal base material, connecting the connection pads and the metal material by wires, thereby arranging two bonding portions connected to two of the wires connected to the connection pads which are adjacent, in a terminal position of the metal base material, forming a resin portion which buries the wires in the opening portion of the wiring substrate, removing the metal base material, removing the bonding portions from the two wires by polishing a lower face of the resin portion and the bonding portions, and obtaining two contact terminals by removing the resin portion from the lower face and making tip portions of the two wires protrude from the lower face of the resin portion, wherein each diameter of the two contact terminals is equal to each diameter of the two wires in the resin portion, and the two contact terminals are gathered to be separated each other such that the two contact terminals contact one electrode pad of a test object with a pair.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A to 4C are cross-sectional views depicting the method of manufacturing a probe card of the first embodiment (Part 4).

FIG. 5 is a cross-sectional view depicting a probe card of the first embodiment.

DESCRIPTION OF EMBODIMENTS

Hereinbelow, embodiments will be explained with reference to the accompanying drawings.

First Embodiment

FIGS. 1A to 4C are views depicting a method of manufacturing a probe card of a first embodiment. FIG. 5 is a view depicting a probe card of the first embodiment. In this embodiment, while explaining of the method of manufacturing a probe card, a structure of the probe card will be explained.

Figure 1A:
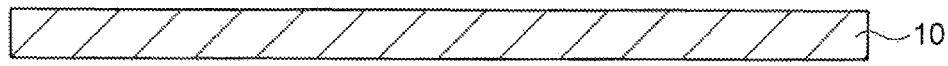
FIGS. 1A to 1F are cross-sectional views depicting a method of manufacturing a probe card of a first embodiment (Part 1).

In the method of manufacturing a probe card of the first embodiment, as depicted in FIG. 1A, first, a copper (Cu) foil 10 whose thickness is about 200 μm is prepared. A nickel (Ni) foil or the like may be used instead of the copper foil 10.

Figure 1B:
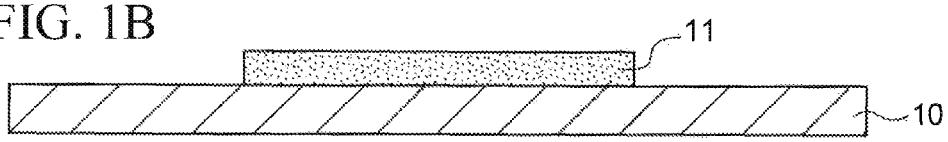
Figure 1C:
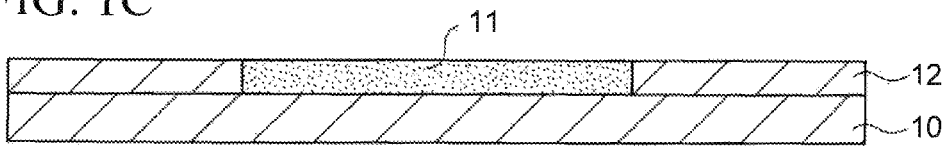

Then, as depicted in FIG. 1B, a plating resist layer 11 is formed by the photolithography on the copper foil 10 in a quadrangle center region. Further, as depicted in FIG. 1C, a copper layer 12 is formed on the exposed face of the copper foil 10 by electroplating utilizing the copper foil 10 as a plating power feeding path. The thickness of the copper layer 12 is set to about 10 μm to 100 μm.

Figure 1D:
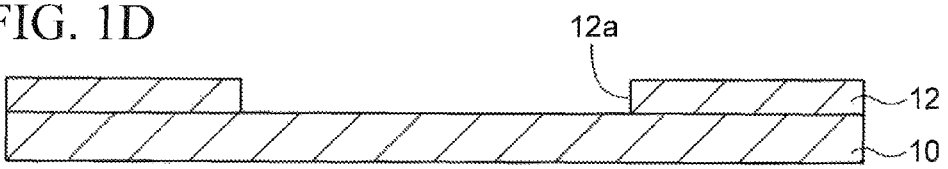

Thereafter, as depicted in FIG. 1D, the plating resist layer 11 is removed. By this matter, a frame-shaped copper layer 12 is thickly formed on a peripheral part of the copper foil 10, and a concave portion 12a is formed in a center region of the copper layer 12.

Besides this method, a resist layer in which an opening portion is provided in a center region may be patterned on a thick copper foil 10, and while using this resist layer as a mask, the cooper foil 10 may be etched until a halfway position of the thickness to form a concave portion therein.

Figure 1E:
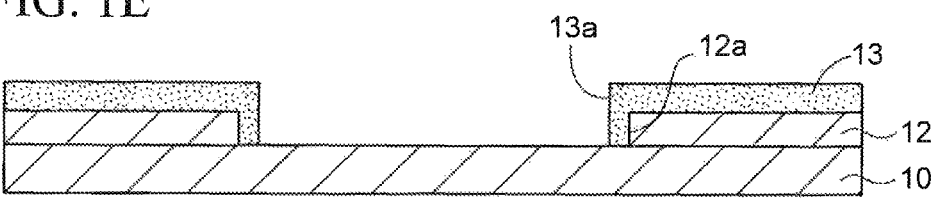

Then, as depicted in FIG. 1E, a plating resist layer 13 in which an opening portion 13a is arranged in the center region of the copper foil 10 is formed by the photolithography. The opening portion 13a of the plating resist layer 13 is arranged inside than the concave portion 12a of the copper layer 12. Specifically, the plating resist layer 13 is arranged so as to cover an inner wall face and an outer peripheral part of the bottom face of the concave portion 12a of the copper layer 12.

Figure 1F:
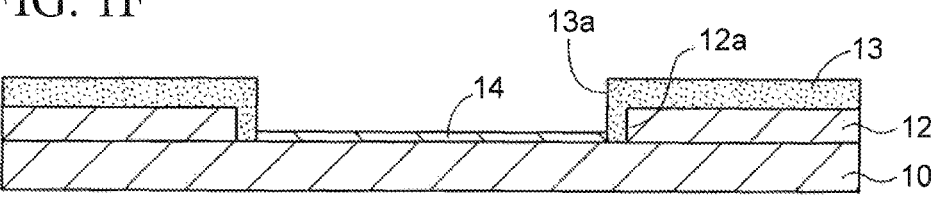

Subsequently, as depicted in FIG. 1F, a gold layer 14 is formed on the copper foil 10 in the opening portion 13a of the plating resist layer 13 by electroplating utilizing the copper foil 10 as a plating power feeding path. Then, as depicted in FIG. 2, the plating resist layer 13 is removed.

By this matter, it is in a state that the gold layer 14 is arranged on the copper foil 10 in the concave portion 12a of the copper layer 12. The gold layer 14 is formed as an adhesion layer to be used when gold wires are bonded on the copper foil 10 by wiring bonding, and its thickness is set to about 100 nm to 400 nm, for example.

At the time of forming the plating resist layer 13 in FIG. 1E, a plurality of pad-shaped opening patterns may be formed according to the positions at which the gold wires are to be bonded as described, later, and a gold plating layer 14 may be formed in the opening patterns.

As described above, in this embodiment, as a preferred example of a metal base material, such a structure is used that the frame-shaped copper layer 12 is stacked on the peripheral part of the copper foil 10, and the gold layer 14 is formed on the bottom face of the concave portion 12a of the copper layer 12. In the case that a nickel foil instead of the copper foil 10 is used, a frame-shaped nickel layer may be formed similarly by electroplating instead of the copper layer 12.

Figure 2A:
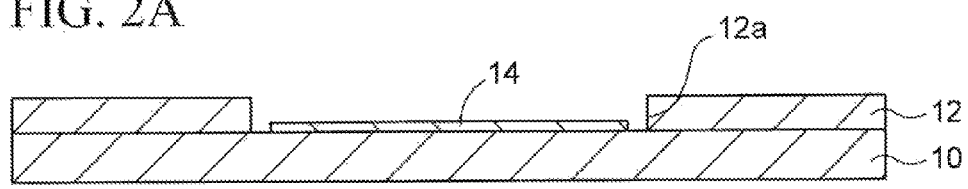
FIGS. 2A to 2C are cross-sectional views depicting the method of manufacturing a probe card of the first embodiment (Part 2).
Figure 2B:

Then, as depicted in FIG. 2B, a frame-shaped wiring substrate 5 is prepared in which an opening portion 5a penetrating in the thickness direction is provided in the center. In the wiring substrate 5, first wiring layers 31 are formed on a first insulating layer 21.

A second insulating layer 22 in which first via holes VH1 are provided is formed on the first insulating layer 21, the first via holes VH1 reaching the first writing layers 31. Second wiring layers 32 are formed on the second insulating layer 22, the second wiring layers 32 being connected to the first wiring layers 31 through the first via holes VH1.

Further, likewise, a third insulating layer 23 in which second via holes VH2 are provided is formed on the second insulating layer 22, the second via holes VH2 reaching the second wiring layers 32. Third wiring layers 33 are formed on the third insulating layer 23, the third wiring layers 33 being connected to the second wiring layers 32 through the second via holes VH2.

The first to third insulating layers 21, 22, 23 are formed of resin or the like. The first to third wiring layers 31, 32, 33 are formed of copper or the like.

The side face of the opening portion 5a of the wiring substrate 5 is formed like a step shape. The first insulating layer 21 has a frame-shaped first step face S1 protruding inward from the end of the second insulating layer 22. Moreover, the second insulating layer 22 has a frame-shaped second step face 32 protruding inward from the end of the third insulating layer 23. Then, connection pads P are formed on the first and second step faces S1, S2 respectively.

The connection pads P are connected to the first and second wiring layers 31, 32. Moreover, the connection pads P each includes a contact layer (not depicted) such as a nickel/gold plating layer on its surface.

The area of the opening portion 5a of the wiring substrate 5 is set to an area one size larger than the area of the concave portion 12a of the copper layer 12 in FIG. 2A mentioned above.

There are various wiring substrates available for the wiring substrate 5. For example, a printed wiring substrate using glass epoxy resin as a substrate may be used, in which case cost reduction is possible.

In this way, the wiring substrate 5 is prepared which includes the opening portion 5a and the connection pads P arranged in an upper face region of the periphery of the opening portion 5a.

Figure 2C:
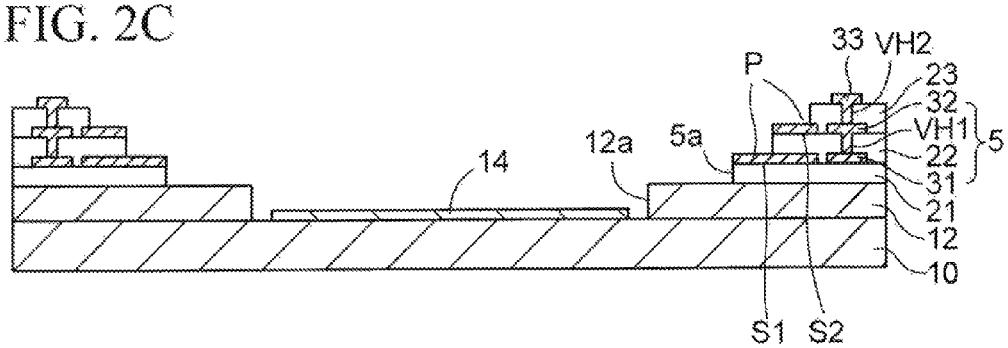

Thereafter, as depicted in FIG. 2C, the lower face of the wiring substrate 5 in FIG. 2B is bonded to the copper layer 12 of the structure in FIG. 2A by an adhesive layer (not depicted). By this matter, it is in a state that the gold layer 14 on the copper foil 10 is exposed in the opening portion 5a of the wiring substrate 5. As the adhesive layer, an epoxy resin-based adhesive sheet, an epoxy resin-based liquid adhesive agent, or the like is used, for example.

Figure 3A:
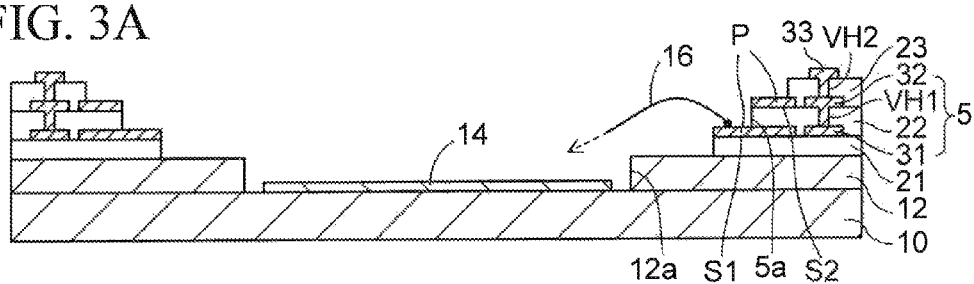
FIGS. 3A to 3D are cross-sectional views depicting the method of manufacturing a probe card of the first embodiment (Part 3).

Then, as depicted in FIG. 3A, on the basis of wiring bonding, a tip portion of a gold wire 16 protruding from a wire bonder's capillary (not depicted) is rounded into a ball shape by electric discharge. Then, the capillary is lowered to touch the tip ball-shaped portion of the gold wire 16 to one of the connection pads P of the wiring substrate 5, and then while the tip ball-shaped portion is pressed, heating and ultrasonic vibration are performed, thereby the tip ball-shaped portion is bonded to the connection pad P.

Figure 3B:
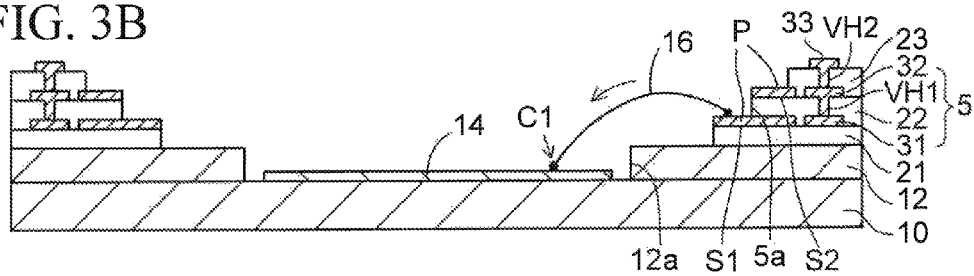

Thereafter, as depicted in FIG. 3B, the capillary is raised to move the gold wire 16 onto the gold layer 14 on the copper foil 10, and the gold wire 16 is bonded to the gold layer 14 in a similar manner, thereby a first gold bonding portion C1 connected to the gold wire 16 is formed on the gold layer 14.

A plurality of terminal positions at which contact terminals are arranged are defined on the surface of the gold layer 14, and the gold wire 16 is bonded to predetermined terminal positions of the gold layer 14, thus the first gold bonding portion C is arranged. For example, one terminal position corresponds to the section of one electrode pad of the test object. After the first gold bonding portion C1 is formed on the gold layer 14 by the gold wire 16, the gold wire 16 is cut from the first gold bonding portion C1.

Figure 3C:
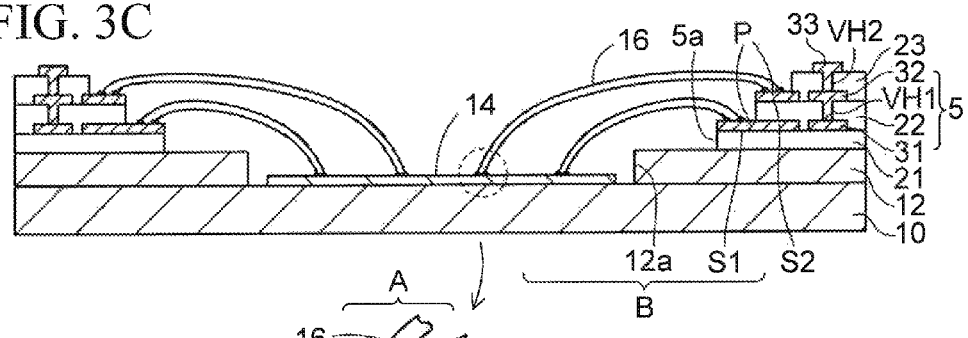

As depicted in FIG. 3C, by repeating the series of steps in the above-described wire bonding, the connection pads P of the wiring substrate 5 and the plurality of terminal positions defined on the gold layer 14 are sequentially connected each other by gold wires 16 respectively.

Figure 3D:
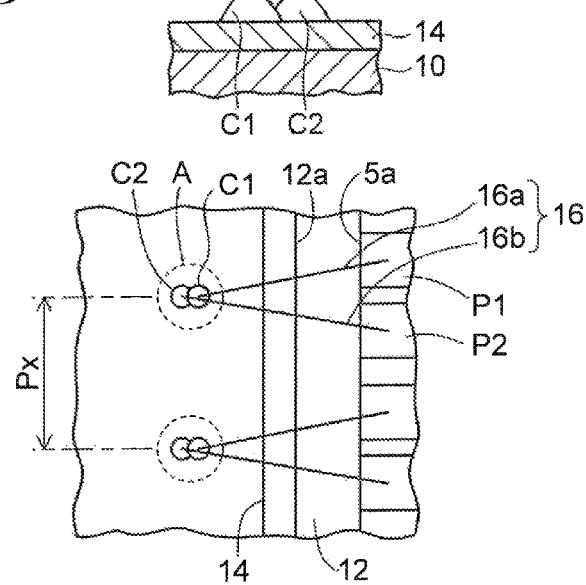

FIG. 3D depicts a partial plan view of an area B in the frame region having four sides of the wiring substrate in FIG. 3C.

As depicted in the partially enlarged cross-sectional view in FIG. 3O and the partial plan view in FIG. 3D, the first gold bonding portion C1 and the second gold bonding portion C2 are arranged in one terminal position A on the gold layer 14 so as to align along the extending direction of their gold wires 16. At this time, the first gold bonding portion C1 and the second gold bonding portion C2 may overlap and be connected each other.

Alternatively, the first gold bonding portion C1 and the second gold bonding portion C2 may be arranged to be separated each other. Two gold wires 16a, 16b connected to the first gold bonding portion C1 and the second gold bonding portion C2 are arranged to be separated each other so that the short circuit is not generated.

As depicted in the partial plan view in FIG. 3D, the first gold bonding portion C1 in one terminal position A on the gold layer 14 is connected to a first connection pad P1 of the wiring substrate 5 by the first gold wire 16a. Moreover, the second gold bonding portion C2 in the same terminal position A is connected to a different second connection pad P2 arranged to be adjacent to the first connection pad P1 by the second gold wire 16b.

By the above steps, two first and second bonding portions C1, C2 connected to two gold wires 16a, 16b connected to adjacent connection pads P are arranged in each of the plurality of terminal positions A defined on the gold layer 14 respectively.

In this way, in the frame region having four sides of the wiring substrate 5, the plurality of gold wires 16 extend into the opening portion 5a from the connection pads P, respectively, and the first and second gold bonding portions C1, C2 connected to each of the gold wires 16 are paired and are arranged in the terminal positions A respectively.

In this embodiment, as will be described later, tip portions of the two gold wires 16a, 16b connected to the first geld bonding portion C1 and the second gold bonding portion C2 arranged at one terminal position A is constituted as a pair of contact terminals. Thus, This structure can be adapted to four-terminal test.

A pitch Px of arrangement (FIG. 3D) between the pair of first and second gold bonding portions C1, C2 and their adjacent pair of first and second gold bonding portions C1, C2 is determined by the limit specification of the wiring bonding technique. In the case that the gold wires 16 whose diameter is 10 μm to 20 μm is used, it is possible that the arrangement pitch of the wire is advanced to a narrower pitch in about 40 μm or less.

By this matter, in this embodiment, the pitch Px of arrangement (FIG. 3D) between each pair of first and second gold bonding portions C1, C2 and their adjacent pair of first and second gold bonding portions C1, C2 can be advanced to the narrower pitch in about 40 μm. As will be described later, pairs of contact terminals for four-terminal test are arranged at the same pitch as the arrangement pitch Px in FIG. 3D. Therefore, the four-terminal test with the narrow pitch is possible.

As will be described later, after the plurality of gold wires 16 are sealed with a resin portion, this resin portion is polished to remove the first and second gold bonding portions C1, C2 and separate their two gold wires 16a, 16b each other. Then, the resin portion is etched, thereby pairs of contact terminals protruding from the resin portion are obtained.

When the first and second gold bonding portions C1, C2 are formed, the gold wires 16 are crushed, so that the first and second gold bonding portions C1, C2 are made to a size approximately twice larger than the diameter of the gold wires 16, and are arranged. For this reason, if the first and second gold, bonding portions C1, C2 are arranged to the direction perpendicular to the extending direction of the gold wires 16, the two gold wires 16a, 16b sometimes interfere in their root portions of the first and second gold bonding portions C1, C2, and both are connected each other.

If the two gold wires 16a, 16b interfere in their root portions and are connected, when separating the two gold wires 16a, 16b each other, it is necessary to remove the resin portion thickly by that amount. Accordingly, more advanced process management is needed.

For this reason, as depicted in FIG. 3D, as a preferred mode, the first and second gold bonding portions C1, C2 are arranged on a line along the extending direction of the gold wires 16. By this matter, the structure in which the two gold wires 16a, 16b do not interfere in their root portions of the first and second gold bonding portions C1, C2 is constituted.

For this reason, the two gold wires 16a, 16b can be easily separated each other by only removing the resin portion relatively thinly. By this matter, the distance between the paired contact terminals for four-terminal test can be made narrow, and also the pitch between each pair of contact terminals and their adjacent pair of contact terminals can be made narrow. Therefore, a probe card preferable for four-terminal test can be obtained.

The number of step faces of the wiring substrate 5 is adjusted according to the number of contact terminals. In this embodiment, the connection pads P are arranged on the two first and second step faces S1, S2, however, the number of connection pads can be increased by increasing the number of step faces according to the number of contact terminals.

In this embodiment, in order to bond the first and second gold bonding portions C1, C2 on the surface of the copper foil 10 by wiring bonding with high reliability, the gold layer 14 is formed as an adhesion layer or the copper foil 10. However, the gold layer 14 as such an adhesion layer is not necessarily required. It is possible to omit the gold layer 14 and bond the first and second gold bonding portions C1, C2 directly to the surface of the copper foil 10.

Alternatively, a silver (Ag) layer may be formed as an adhesion layer instead of the gold layer 14.

Moreover, copper wires may be used instead of the gold wires 16, and copper bonding portions may be formed on the copper foil 10. In the case that the copper wires are used as well, a gold layer or a silver layer is preferably formed as an adhesion layer on the copper foil 10.

Then, as depicted in FIG. 4A, low-viscosity liquid resin is coated into the opening portion 5a of the wiring substrate 5 in which the plurality of gold wires 16 are arranged, thereby the liquid resin is filled in the opening portion 5a of the wiring substrate 5. Thereafter, the liquid resin is cured by a heating process to bury the plurality of gold wires 16 in a resin portion 40.

The resin portion 40 is formed of a resin material having elasticity or a rubber material. A material with a Young's modulus of 1 MPa to 10 MPa such as a silicone-based low-elasticity resin or a fluororubber may be used as one preferred example. Alternatively, a low-elasticity acrylic resin, a urethane rubber, or the like may be used.

Then, as depicted in FIG. 4B, the copper foil 10 and the copper layer 12 are removed by wet etching. An iron(II) chloride aqueous solution, a copper (II) chloride aqueous solution, or the like is available as the copper etchant. In this way, the copper foil 10 and the copper layer 12 can be selectively removed to the gold layer 14, the resin portion 40, and the first insulating layer 21 of the wiring substrate 5.

Thus, it is in a state that the lower face of a peripheral side of the resin portion 40 and the lower face of the gold layer 14 are exposed. The resin portion 40 is exposed in a state that it has a protruding portion 40x corresponding to the concave portion 12a of the copper layer 12 in FIG. 1D.

Alternatively, in the case that a nickel foil is used instead of the copper foil 10, a mixed solution of aqueous hydrogen peroxide and nitric acid, or the like is used as the etchant, thereby, likewise selective removal to the base can be performed.

As the metal base material, one using the coil foil 10 or a nickel foil as the base is illustrated. It is possible to use a different metal material as long as it is a metal which can be selectively removed to the gold layer 14, the resin portion 40, and the first insulating layer 21 of the wiring substrate 5.

Then, as depicted in FIG. 4C, in the lower face side of the structure in FIG. 4B, the gold layer 14 and the resin portion are polished by chemical mechanical polishing (CMP), and further polished until the exposed first and second gold bonding portions C1, C2 are completely removed.

By this matter, the first and second gold bonding portions C1, C2 removed by the polishing, thereby it is in a state that tip portions of the gold wires 16 are separated and become independent each other. At this point, the tip portions of the gold wires 16 are in a state of being buried in the resin portion 40, and the polished faces of the gold wires 16 and the polished face of the resin portion 40 constitute the same face.

Then, as depicted in FIG. 5, the resin portion 40 in the lower side of the structure in FIG. 4C is selectively removed to the gold wires 16 by a predetermined thickness amount by means of the dry etching. The resin portion 40 is removed from its lower face by such a thickness amount that the tip portions of the first and second gold wires 16a, 16b are exposed in a state that they are separated and become independent each other.

Isotropic etching using a $CF_4/O_2$-based etching gas is preferably employed as the dry etching.

By this matter, the tip portions of the gold wires 16 protrude from the lower face of the resin portion 40, and constitute contact terminals T. A protruding height H of each contact terminal T from the lower face of the resin portion 40 is about 0.1 μm, for example. However, the contact terminal T may protrude with about 10 μm to 20 μm.

By the above steps, a probe card 1 of the first embodiment is obtained.

As depicted in FIG. 5, the probe card 1 of the first embodiment includes the frame-shaped wiring substrate 5 in which the opening portion 5a is provided in the center, which is explained in FIG. 21 mentioned above. The connection pads P are formed, on the first step face S1 and the second step face S2 in the side face the opening portion 5a of the wiring substrate 5.

Figure 6A:
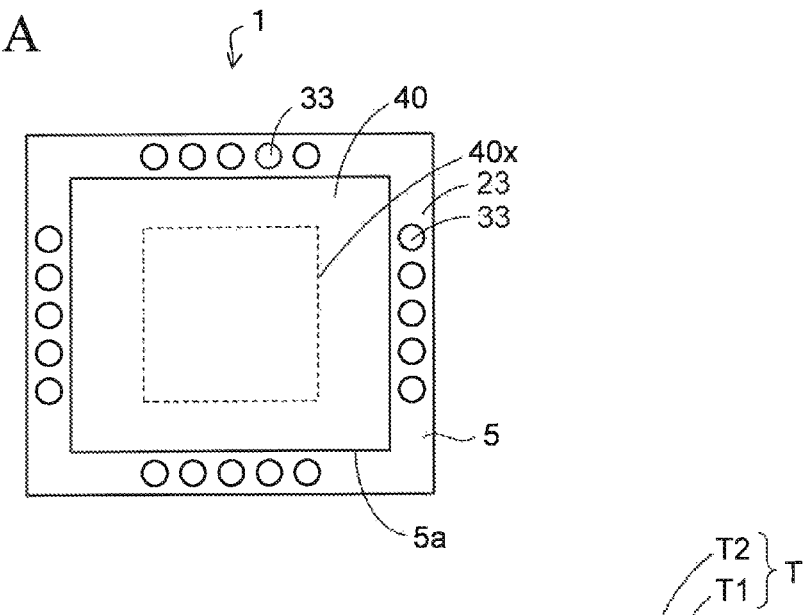
FIG. 6A is a reduced plan view of the probe card in FIG. 5 as seen from above.
Figure 6B:
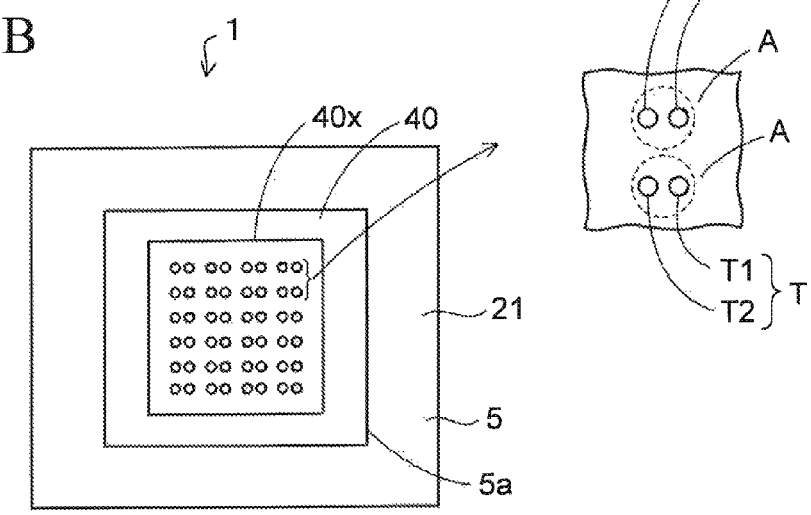
FIG. 6B is a reduced plan view of the probe card in FIG. 5 as seen from below.

FIG. 6A is a reduced plan view of FIG. 5 as seen from an upper side U, and FIG. 6B is a reduced plan view of FIG. 5 as seen from a lower side L.

Referring to FIG. 6A in addition to FIG. 5, the resin portion 40 is filled in the quadrangle opening portion 5a in the center of the wiring substrate 5. The resin portion 40 has the protruding portion 40x protruding downward from the lower face of the wiring substrate 5. Moreover, the third wiring levers 33 (pads) are arranged to be aligned in the frame region having the four sides of the wiring substrate 5 respectively.

Moreover, referring to FIG. 6B in addition to FIG. 5, the contact terminals T are arranged to be aligned with an area array type in the lower face of the protruding portion 40x of the resin portion 40. One end of each gold wire 16 is connected to the connection pads P of the wiring substrate 5 in a state that each gold wire 16 is buried in the resin portion 40. Moreover, the other end of the gold wire 16 protrudes from the lower face of the resin portion 40, and constitutes the contact terminal T.

As depicted in FIGS. 5 and 6B, a pair of first and second contact terminals T1, T2 for four-terminal test are arranged to be aligned with a narrow distance at one terminal position A. A distance D between the first and second contact terminals T1, T2 in FIG. 5 is set to about 2 μm to 5 μm, for example.

As depicted in FIG. 5, the probe card 1 of the first embodiment includes the first wire 16a in which one end is connected to the first connection pad P (see FIG. 3D) and the other end constitutes the first contact terminal. T1 protruding from the lower face of the resin portion 40.

Also, the probe card 1 of the first embodiment includes the second wire 16b in which one end is connected to the second connection pad P adjacent to the first connection pad P (see FIG. 3D) and the other end constitute a second contact terminal 12 protruding from the lower face of the resin portion 40. The first contact terminal T1 and the second contact terminal T2 are gethered to be separated each other in a planed terminal position A such that first and second contact terminals T1, T2 contact one electrode pad of the test object with the pair.

Then, as will be described later, four-terminal test can be performed by contacting the first and second contact terminals T1, T2 which are gethered and separated each other to one electrode pad of the test object with the pair.

Moreover, as depicted in FIG. 5, a contact face CS of the tip of each contact terminal T is formed as a flat face. Further, since the contact terminal 1 is formed of the tip portion of the gold wire 16, a diameter W1 of the contact terminal T protruding from the resin portion 40 is equal to a diameter W2 of the gold wire 16 buried in the resin portion 40.

Furthermore, the first contact terminal T1 and the second contact terminal T2 are inclined in the same direction toward the center side of the resin portion 40 in the region from their roots to their tips, exposed from the resin portion 40.

In this embodiment, unlike the prior art, terminals having a spherical shape or the like which is thicker than the gold wires 16 are not used as the contact terminals T. Thus, the diameter of one contact terminal T can be made small. For this reason, it is possible form pairs of contact terminals T in which first and second contact terminals T1, T2 are aligned with a narrow distance therebetween. As a result, it is possible to constitute the probe card for the four-terminal test which can response to the narrower pitch of the electrode pads of test objects.

Then, the each contact terminal T is electrically connected to the connection pads P of the wiring substrate 5 by the gold wire 16, respectively. Each gold wire 16 is buried in the resin portion 40 and held by the resin portion 40. The number of step faces on which the connection pads P of the wiring substrate 5 are arranged is suitably adjusted according to the number of contact terminals T.

The resin portion 40 is formed of a silicone-based low-elasticity resin, a fluororubber, or the like and has moderate elasticity. Each gold wire 16 is drawn around inside the resin portion 40, and the tip portion of the gold wire 16 protrudes from the lower face of the protruding portion 40x of the resin portion 40, thereby the contact terminal T is provided. By this matter, when the elastic resin portion 40 is pressed downward, appropriate contact pressure can be applied to each contact terminal T.

The resin portion 40 has the protruding portion 40x, thereby the resin portion 40 can be elastically deformed more easily. Accordingly, the contact of the contact terminals T to the test object can be made stable.

Note that, in the case that the protruding portion 40x is not necessary, the protruding portion 40x of the resin portion 40 may be omitted. In this case, the steps in FIGS. 1B to 1D mentioned above are omitted, and in the probe card 1 in FIG. 5, the structure is employed in which the lower face of the resin portion 40 and the lower face of the wiring substrate 5 are the same face.

Moreover, in the probe card 1 of this embodiment, each contact terminal T, and the wire electrically connecting the contact terminal T and the wiring substrate 5 can be integrally formed by using the same single gold wire 16. Therefore, the probe card can be manufactured at a good yield and at a low cost.

Next, a method of measuring electric characteristics of a test object by using the probe card 1 of the first embodiment will be explained.

Figure 7:
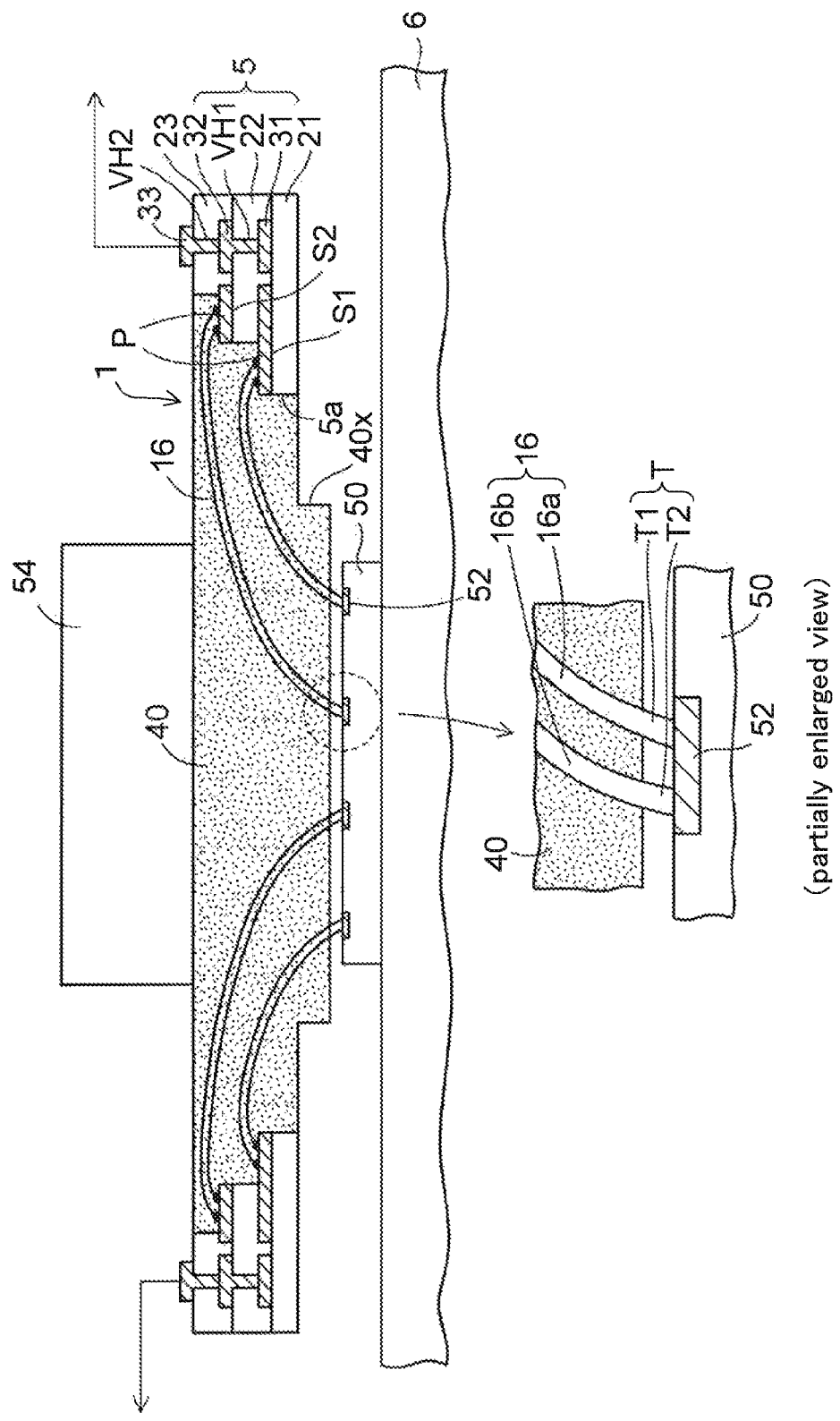
FIG. 7 is a cross-sectional view depicting a state that electric characteristics of a wiring substrate are measured by the probe card in FIG. 5.

As depicted in FIG. 7, terminals of a testing device (not depicted) such as an measuring instrument or the like are electrically connected to the third wiring layers 33 (pads) of the probe card 1. Then, various test signals are supplied from the testing device to the test object through the probe card 1, thereby the electric characteristics of the test object are measured.

FIG. 7 depicts an example of measuring the electric characteristics of a wiring substrate such as an interposer or the like. The probe card 1 is arranged on a measuring-target wiring substrate 50 placed on a stage 6 such that the contact terminals T of the probe card 1 contact electrode pads 52 of the wiring substrate 50.

As depicted in the partially enlarged view in FIG. 7, the probe card 1 of this embodiment is capable of four terminal test. The first contact terminals T1 connected to the first wires 16a and the second T2 connected to the second wires 16a contact one electrode pad 52 of the measuring-target wiring substrate 50 in a state that they are separated with the pair. For example, the circuit to be connected to the first contact terminal T1 constitutes the current supplying circuit, and the circuit to be connected to the second contact terminal T2 constitutes the voltage measuring circuit.

In a case of general two-terminal testing, the wiring resistance in the probe card 1, and the contact resistance between the contact terminal T and the electrode pad 52 of the wiring substrate 50 for the measurement, are included. For this reason, it is difficult to accurately measure the resistance value of only the wiring substrate 50.

However, by employing four-terminal test, since the circuit in which electric current is caused to flow and the circuit in which voltage is measured are independent each other, the wiring resistance and the contact resistance can be ignored. Accordingly, the resistance value of the wiring substrate 50 can be measured accurately.

Further, a pressing mechanism 54 is arranged on the resin portion 40 of the probe card 1, and the resin portion 40 is pressed downward. The pressing force of the pressing mechanism 54 is detected by load detecting means such as a load cell or the like and adjusted.

As mentioned above, since the resin portion 40 has moderate elasticity, the resin follows to the pressing force applied from the pressing mechanism 54. Thereby all the contact terminals T can be pressed to the electrode pads 52 of the wiring substrate 50 at moderate contact pressure. In addition, since the resin portion 40 has the protruding portion 40x protruding from the lower face of the wiring substrate 5, the resin portion 40 can be elastically deformed more easily. Thus, the stability of contact of the contact terminals T1, T2 can be improved.

As described above, the probe card 1 of this embodiment includes the pressing mechanism 54 for adjusting the contact pressure of the contact terminals T. By this matter, on the basis of supplying the electric current from the testing device to the wiring substrate 50, electrical test such as measuring the resistance value or the like of the wiring substrate 50 can be performed reliably.

Note that, in this embodiment, the wiring substrate 50 such as the interposer or the like as the test object is illustrated. The probe card 1 can be used for electrical test of various other electronic components. As other electronic components, there is a semiconductor substrate such as a silicon wafer in which the semiconductor circuit is formed, or a module substrate in which a semiconductor chip is mounted on a wiring substrate.

Moreover, in this embodiment, the mode is illustrated in which the contact terminals T of the probe card 1 are arranged with the area-array type. The peripheral type in which the contact terminals T are arranged only in the periphery may be employed.

Furthermore, a two-terminal test probe card may be manufactured by using the manufacturing method of this embodiment.

Second Embodiment

Figure 8A:
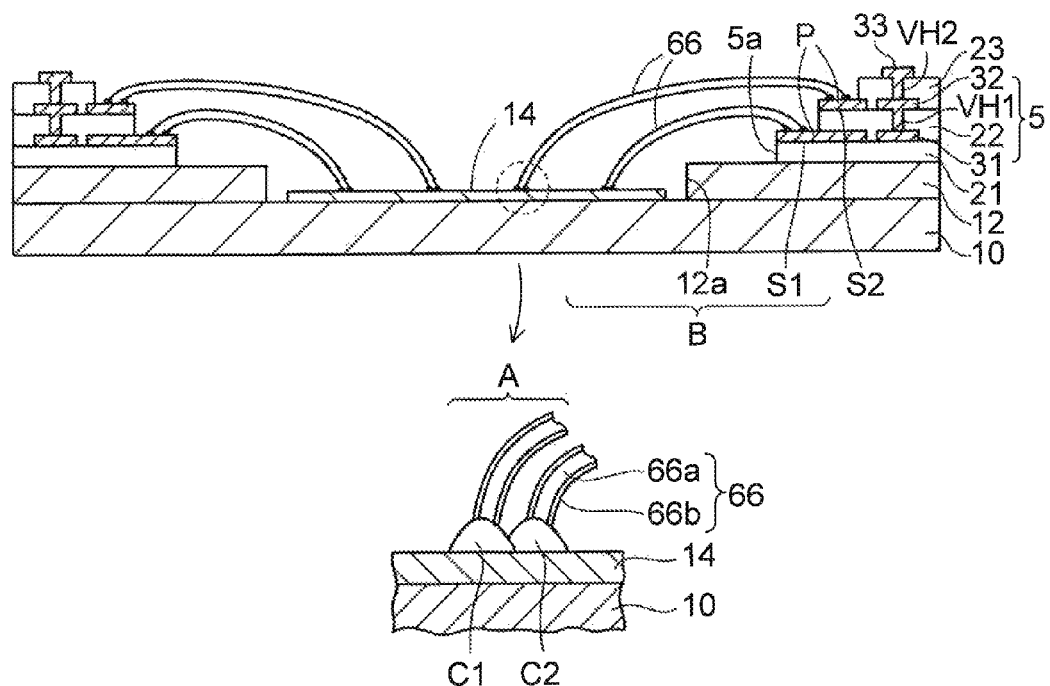
FIGS. 8A and 8B are cross-sectional views depicting a method of manufacturing a probe card of a second embodiment.
Figure 8B:
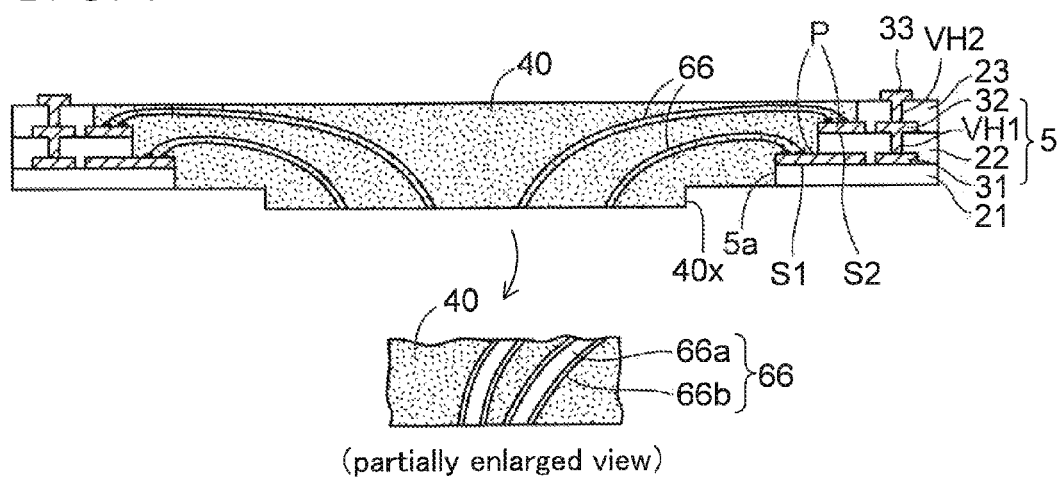
Figure 9:
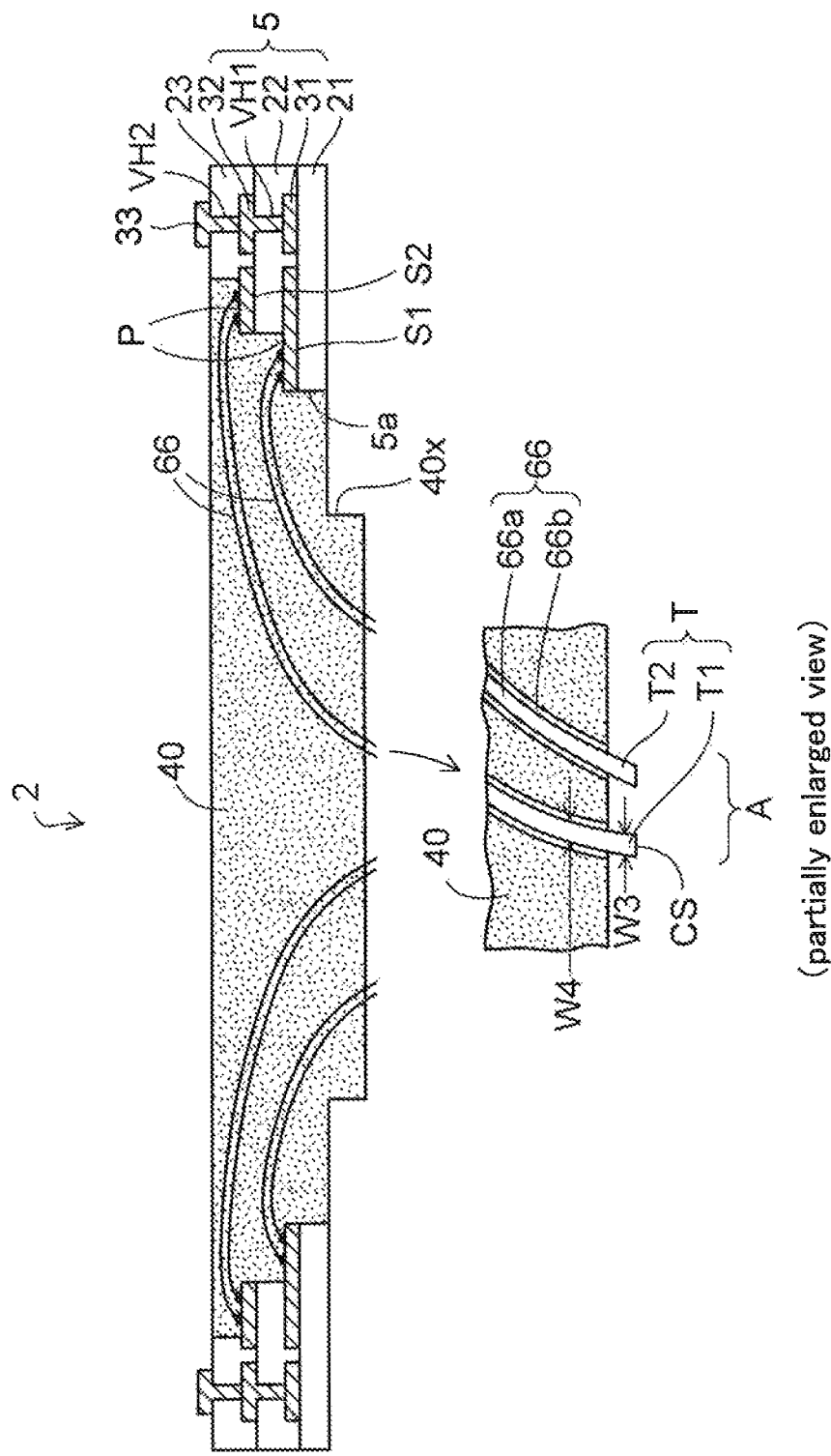
FIG. 9 is a cross-sectional view depicting a probe card of the second embodiment.

FIGS. 8A and 8B are views depicting a method of manufacturing a probe card of a second embodiment. FIG. 9 is a view depicting a probe card of the second embodiment. In the second embodiment, gold wires with insulation coating are used.

As depicted in FIG. 8A, in the method of manufacturing a probe card of the second embodiment, gold wires 66 with insulation coating are used instead of the gold wires 16 used in the first embodiment. The gold wires 66 with insulation coating are each formed of a gold wire portion 66a and an insulation coating portion 66b made of resin or the like coating the outer face thereof.

Then, like FIG. 3C in the first embodiment, connection pads P of a wiring substrate 5 and a plurality of terminal positions A defined on a gold layer 14 are connected by the gold wires 66 with insulation coating. When wire bonding of each gold wire 66 with insulation coating is performed, the insulation coating portion 66b is ripped and the gold wire portion 66a is bonded to the connection pad P of the wiring substrate 5 and the terminal position A on the gold layer 14.

In this way, like the first embodiment, the gold wire portions 66a are bonded to the connection pads P of the wiring substrate 5, and first and second gold bonding portions C1, C2 connected to the gold wire portions 66a are formed in the plurality of terminal positions A on the gold layer 14 on a copper foil 10, respectively.

Then, as depicted in FIG. 8B, the same steps as those in FIGS. 4A to 4C in the first embodiment are performed, so that the polished faces of the gold wires 66 with insulation coating and the polished face of a resin portion 40 are formed as the same face each other.

Thereafter, referring to add FIG. 9, by using a similar method to the step in FIG. 5 in the first embodiment, the resin portion 40 is removed by the predetermined thickness amount from the lower face of the resin portion 40 by means of the dry etching. In this step, the insulation coating portions 66b coating the gold wire portions 66a are etched and removed at the same time as the resin portion 40, thereby the gold wire portions 66a are exposed.

By this matter, as depicted in FIG. 9, like FIG. 5 in the first embodiment, tip portions of the gold wire portions 66a protrude from the lower face of a protruding portion 40x of the resin portion 40, so that first and second contact terminals T1, T2 are obtained in one terminal position A. By the above steps, a probe card 2 of the second embodiment is manufactured.

In the probe card 2 of the second embodiment, like the first embodiment, a contact face CS of the tip of each contact terminal T is formed as a flat face. Moreover, since the contact terminal T is formed of the tip portion of the gold wire portion 66a, a diameter W3 of the contact terminal T protruding from the resin portion 40 is equal to a diameter W4 of the gold wire portion 66a buried in the resin portion 40. Further, the diameter W3 of the contact terminal T is smaller than the diameter of the gold wire 66 buried in the resin portion 40, the diameter of the gold wire 66 including the gold wire portion 66a and the insulation coating portions 66b.

Moreover, the first contact terminal T1 and the second contact terminal T2 are inclined in the same direction toward the center side of the resin portion 40 in the region from their roots to their tips, exposed from the resin portion 40.

Since the gold wires 66 with insulation coating are used in the second embodiment, even if they contact each other, there is no fear that a short circuit is caused between the wires. For this reason, it is no longer necessary to care about contact of the wires, and therefore the degree in the freedom of drawing around the wires can be improved. Accordingly, the wire bonding by the narrower pitch is possible, and the narrower pitch of the contact terminals can be further attained.

The probe card 2 of the second embodiment brings about advantageous effects similar to those by the probe card 1 of the first embodiment.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a probe card, comprising:
preparing a wiring substrate including an opening portion and connection pads arranged in a periphery of the opening portion;
bonding the wiring substrate to a metal base material;
connecting the connection pads and the metal base material by wires, thereby arranging two bonding portions connected to two said wires, the two wires which are connected to the adjacent connection pads, in a terminal position of the metal base material;
forming a resin portion which buries the wires in the opening portion of the wiring substrate;
removing the metal base material;
removing the bonding portions from the two wires by polishing a lower face of the resin portion and the bonding portions; and
obtaining two contact terminals by removing the resin portion from the lower face and making tip portions of the two wire protrude from the lower face of the resin portion, wherein
each diameter of the two contact terminals is equal to each diameter of the two wires in the resin portion, and
the two contact terminals are gathered to be separated each other such that the two contact terminals contact one electrode pad of a test object with a pair.

(Clause 2) The method of manufacturing a probe card according to Clause 1, wherein the two contact terminals are aligned in an extending direction of the wires.

(Clause 3) The method of manufacturing a probe card according to Clause 1, wherein a contact face of a tip of each of the contact terminals is formed as a flat face.

(Clause 4) The method of manufacturing a probe card according to Clause 1, wherein the two contact terminals are inclined in the same direction toward a center side of the resin portion.

(Clause 5) The method of manufacturing a probe card according to Clause 1, wherein each of the wires is a wire with insulation coating.

What is claimed is:

1. A probe card, comprising:
a wiring substrate including an insulating layer and a wiring layer formed on the insulating layer;
an opening portion penetrating the insulating layer and the wiring layer of the wiring substrate in a thickness direction, the opening portion having a quadrangle shape in a plan view, wherein four side faces of the opening portion are formed in a step shape, and have step faces;
a first connection pad and a second connection pad arranged on the step faces of one side face in the four side faces of the opening portion so as to be adjacent each other, the first connection pad and the second connection pad exposed from an inner face of the opening portion, the first connection pad and the second connection pad each connected to one of the wiring layer;
a resin portion formed in the opening portion of the wiring substrate, the resin portion burying the first connection pad and the second connection pad;
a first bonding wire buried in the resin portion, the first bonding wire in which one end is connected to the first connection pad and the other end constitutes a protruding portion protruding from a lower face of the resin portion;
a first contact terminal formed from the protruding portion of the first bonding wire, the first contact terminal protruding downward from the lower face of the resin portion, in a state that a whole of a side face of the first contact terminal is exposed from the resin portion, wherein the first contact terminal and the first bonding wire are formed of one bonding wire which is made of the same metal;
a second bonding wire buried in the resin portion, the second bonding wire in which one end is connected to the second connection pad and the other end constitutes protruding portion protruding from the lower face of the resin portion; and a second contact terminal formed from the protruding portion of the second bonding wire, the second contact terminal protruding downward from the lower face of the resin portion, in a state that a whole of a side face of the second contact terminal is exposed from the resin portion, wherein the second contact terminal and the second bonding wire are formed of one bonding wire which is made of the same metal;

wherein each diameter of the first contact terminal and the second contact terminal is equal to each diameter of the first bonding wire and the second bonding wire in the resin portion, and the first contact terminal and the second contact terminal are inclined in the same direction toward a center side of the resin portion, from a root exposed from a lower face of the resin portion to a tip in the first connection pad and the second connection pad, and the first contact terminal and the second contact terminal contact one electrode pad of a test object in a pair.

2. The probe card according to claim 1, wherein a contact face of a tip of each of the first contact terminal and the second contact terminal is formed as a flat face.

3. The probe card according to claim 1, wherein the first contact terminal and the second contact terminal are arranged on a line in same direction as in an extending direction of the wires.

4. The probe card according to claim 1, wherein each of the first and second bonding wires is a wire with insulation coating.

5. The probe card according to claim 1, further including a third connection terminal and a fourth connection terminal which are opposite to the first connection terminal and the second connection terminal, the third connection terminal and the fourth connection terminal are inclined in a reverse direction to inclinations of the first connection terminal and the second connection terminal.

\* \* \* \* \*